United States Patent [19]

Dallavalle

[11] Patent Number: 5,311,073
[45] Date of Patent: May 10, 1994

[54] HIGH VOLTAGE CMOS CIRCUIT WITH NAND CONFIGURED LOGIC GATES AND A REDUCED NUMBER OF N-MOS TRANSISTORS REQUIRING DRAIN EXTENSION

[75] Inventor: Carlo Dallavalle, Vimercate, Italy

[73] Assignee: SGS-Thomson Microelectronics s.r.l., Milan, Italy

[21] Appl. No.: 841,621

[22] Filed: Feb. 25, 1992

[30] Foreign Application Priority Data

Feb. 25, 1991 [IT] Italy .................. VA 91 A/0006

[51] Int. Cl.$^5$ .................................. H03K 17/10
[52] U.S. Cl. .......................... 307/443; 307/450; 307/451; 307/481; 257/408
[58] Field of Search .......... 307/443, 475, 450–452, 307/481, 579, 585, 304; 257/336, 339, 344, 372, 408–409

[56] References Cited

U.S. PATENT DOCUMENTS

| | | | |
|---|---|---|---|
| 4,429,237 | 1/1984 | Cranford, Jr. et al. | 307/450 |
| 4,628,341 | 12/1986 | Thomas | 257/339 X |
| 4,922,327 | 5/1990 | Mena et al. | 257/336 |
| 5,016,077 | 5/1991 | Sato et al. | 357/41 |
| 5,089,871 | 2/1992 | Fujihara | 257/339 X |
| 5,126,816 | 6/1992 | Reczek et al. | 257/372 |
| 5,144,389 | 9/1992 | Nakamura et al. | 257/336 X |
| 5,151,616 | 9/1992 | Komuro | 307/443 X |
| 5,170,078 | 12/1992 | Hsueh et al. | 307/451 |

FOREIGN PATENT DOCUMENTS 60-169219 1/1986 Japan .
62-286265 5/1988 Japan .

Primary Examiner—David R. Hudspeth
Attorney, Agent, or Firm—Seed and Berry

[57] ABSTRACT

In a CMOS logic circuit destined to function at a relatively high supply voltage such as to require the formation of graded diffusions in the structure of N-MOS transistors, a NAND configuration is used which comprises a staked pair of N-MOS transistors. This permits to restrict the number of graded diffusions to be formed in N-MOS structures only to the drain regions which are directly connected to an output node. In clocked CMOS circuitry where transfer transistors are normally used between gates, the advantages in terms of enhanced speed and ability of the circuit to be compacted by cutting the number of N-MOS structures necessarily provided with drain extension regions as in prior art circuits, are remarkable.

22 Claims, 3 Drawing Sheets

HIGH VOLTAGE CMOS CIRCUIT WITH NAND CONFIGURED LOGIC GATES AND A REDUCED NUMBER OF N-MOS TRANSISTORS REQUIRING DRAIN EXTENSION

TECHNICAL FIELD

The present invention relates to CMOS logic circuits and, more particularly, to a way to solve the problems of protecting N-MOS transistors from aging and/or failure caused by the phenomenon of impact ionization which occurs under particular conditions of operation at relatively high voltage in CMOS logic gates.

BACKGROUND OF THE INVENTION

The mechanism of the aging and/or failure of N-MOS transistors caused by the phenomenon of impact ionization taking place under particular bias conditions of the gate of the transistor versus its source while the drain is biased at a relatively high voltage in respect to the source potential, is well known and debated in literature.

This problem occurs every time a N-MOS transistor having its drain biased at the supply voltage by a preceding switching on of the P-MOS transistor portion of a CMOS inverter, switches on as a consequence of a raising of the gate voltage. The flow of electrons crossing the channel region of the transistor is accelerated by a synergistic combination of electric fields due to the "summing" of the effects of the $V_{GS}$ and $V_{DS}$ voltages. This causes additional carriers to be driven to the drain coming from electron-hole pairs generated by the impact of high kinetic energy electrons with orbitant electrons of the atoms of the crystal lattice in the drain region. This mechanism generates an additional current known as "substrate current" which adds to the drain-source current. This additional current is highly dangerous because even if a low level (in the order of few |A) may produce locally a direct biasing of the substrate in respect to the source region of the transistor, thus triggering on a parasitic bipolar transistor in parallel to the real N-MOS. The $V_{DS}$ voltage to which this parasitic bipolar transistor switches on is known in literature as the snap-back voltage. This phenomenon may be destructive for the metallic connections (contacts) of the N-MOS, which must convey a far augmented current than the design current. Even where complete failure is avoided, the mechanism at the base of the snap-back phenomenon is such as to cause in time a degradation of the electrical characteristics of the N-MOS transistor. This degradation (aging) due to the presence of high energy electrons in the channel, is cumulative in time, thus producing a progressive loss of functionality of the N-MOS transistors which is even more feared than an instantaneous failure, because the "microscopic" behavior of the integrated circuit varies with time due to the alterations which have occurred at the level of single N-MOS devices, the threshold voltage ($V_{th}$) and transconductance (gm) of which tend to subtly change with time.

It is known that impact ionization and its negative effects may be countered by forming graded drain diffusions (known also as drain extensions). These graded drain diffusions may be obtained by forming a second diffused region having a lower dopant concentration than that commonly used for the drain region proper. The use of drain extensions results in increasing the $V_{DS}$ voltage to which the snap-back phenomenon takes place and reducing the aging process caused by impact ionization, by creating, during the switching on the N-MOS transistor, an electric field of reduced intensity near the drain region of the transistor by virtue of the graded diffusion. Frequently in certain circuit applications, it is necessary for the same prevention reasons, to also form the source diffusion in a similarly graded manner, i.e., provide the N-MOS transistor with "bilateral" (drain) extensions.

The raising of the snap-back voltage causes a reduction of the electrical performance of the N-MOS transistor that is provided with drain extensions, in terms of reduced speed and increased ON-resistance.

Moreover, under the aspect of the fabrication technology of these devices, the necessary use of a dedicated "drain extension" mask, beside complicating the fabrication process, makes the N-MOS transistors more cumbersome in terms of layout and more sensitive to misalignment problems and therefore more difficult to be reduced in size through compacting technologies, also known as "shrinkage processes," toward which any circuit evolves in time for exploiting the improvements that the photolithographic techniques and apparatuses constantly go through.

Thus, while using drain and source extensions solve some problems, it creates new problems, including reduced speed performance and increased power requirement.

All the above-mentioned problems are most frequently encountered in mixed analog-digital integrated CMOS circuits, wherein two different supply voltages are normally present: a low supply voltage (5 V) for the internal logic circuitry which interfaces with the analog portions of the integrated circuit operating at such a higher supply voltage in order to ensure a large dynamic voltage swing.

The logic circuits operating at high supply voltage are therefore potentially sensitive to said snap-back problems constitute parts of the integrated circuit which, because of the large use of graded junctions, raise remarkable problems of increased criticality when attempting a compacting of the integrated circuit for exploiting at best improved fabrication techniques which may have become available.

Therefore, there is a need of logic circuits, i.e., for CMOS logic gates, capable of operating at a relatively high supply voltage and wherein the need of forming graded diffusions in the structure of N-MOS transistors be minimized in order to maintain characteristics of high speed for the propagation of data through the logic gates and ensuring a low internal ON-resistance of the same transistors.

The present invention provides an effective solution to this specific technical problem.

SUMMARY OF THE INVENTION

According to the present invention, a CMOS logic gate, i.e., any CMOS logic circuit, which is designed to operate at a high supply voltage, include two stacked (i.e., connected in electrical series) N-MOS transistors and only the N-MOS transistor whose drain is connected to an output terminal of the logic gate is provided with a graded diffusion, solely in the drain region thereof.

The invention is particularly helpful in circuits whose supply voltage is so high as to require the formation of graded diffusions in the structures of N-MOS transistors in order to increase the voltage between source and drain ($V_{DS}$) at which the switching on of the intrinsic parasitic bipolar transistor in parallel to each real N-MOS transistor takes place.

By employing NAND configured logic gates which comprise two stacked N-MOS transistors and taking advantage of the attendant substrate (body) effect, it is possible to build a circuit which uses graded diffusions only in the N-MOS transistor whose drain is connected to an output terminal of the logic gate and limited to the drain region of one transistor, i.e., making the respective source diffusion and all other diffusions in a normal manner without grading them.

Using the structure of the present invention, the speed of propagation of data through the logic gate is not appreciably reduced because there is only a single graded junction of the drain region of the N-MOS transistor and the whole logic circuit may be more easily compacted through so-called "shrinkage techniques" exploiting advanced fabrication processes.

The present invention takes advantage of the substrate or body effect of an N-MOS transistor whose source is not connected to the substrate to provide a new structure having numerous advantages not possible with the prior art.

The different aspects and advantages of the invention will become more evident through the following description of several embodiments and reference to the attached drawings.

DETAILED DESCRIPTION OF THE INVENTION

Figure 1:
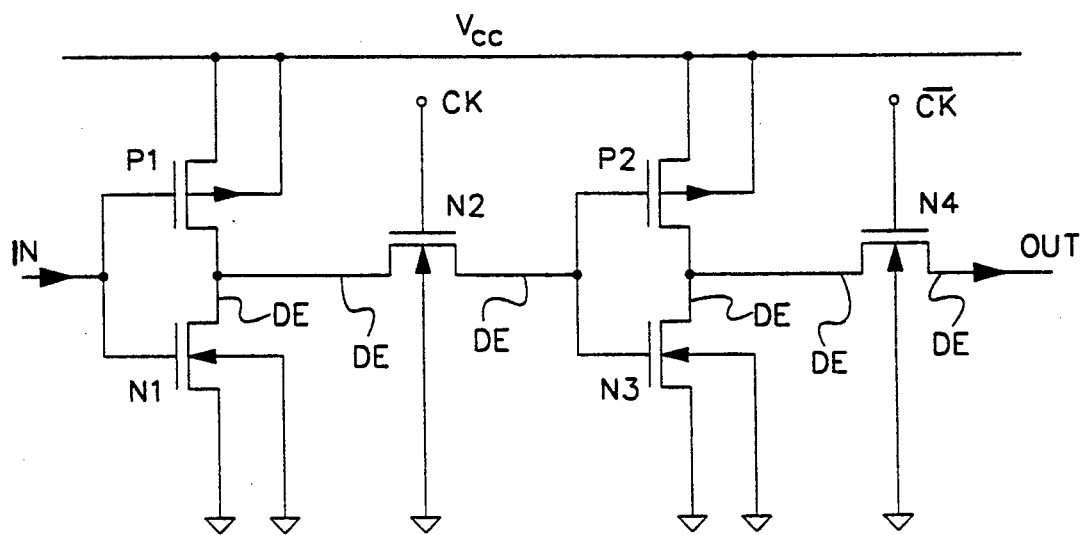
FIG. 1 shows a common CMOS inverter circuit with a transfer device made according to a known prior art technique.

In FIG. 1, a typical inverter circuit with transfer transistor, which is widely used in logic circuits, is shown. The use of an N-MOS transistor as a transfer device requires the formation of graded implantations of both the diffused drain and source junctions because drain and source are substantially interchangeable in the charging/discharging processes of the output/input capacitances. In the circuit of FIG. 1, the junctions requiring graded diffusions for enabling the circuit to work at a relatively high supply voltage ($V_{CC}$), are identified by the letters DE. The strong penalization on the transfer speed characteristics of the circuit due to the large number of graded junctions is evident.

The technical solution provided by the present invention as an alternative to a burdensome use of grated diffusions in the structure of N-MOS transistors for countering the aging mechanism thereof, has a great utility especially in the case of logic circuits employing shift registers and more in general in logic circuits wherein the output is sampled by means of a transfer transistor.

Figure 4:
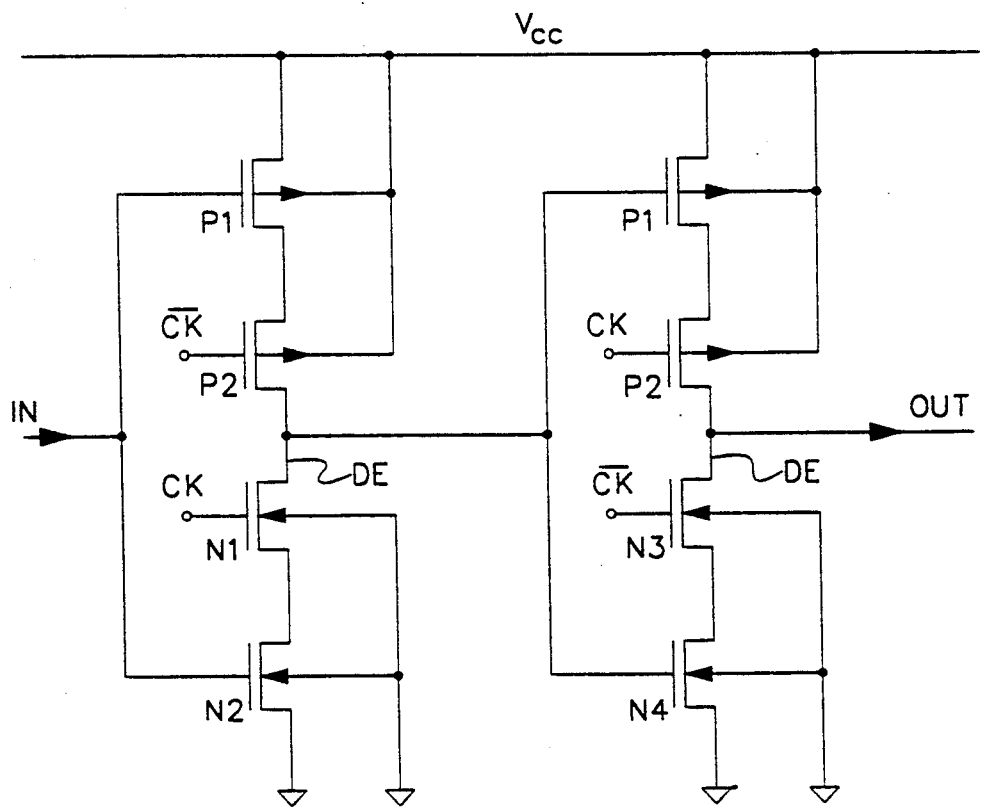
FIG. 4 shows a functionally equivalent circuit of the inverter with a transfer device of FIG. 1 except made according to the present invention and thus having significant advantages over the prior art of FIG. 1.
Figure 3:
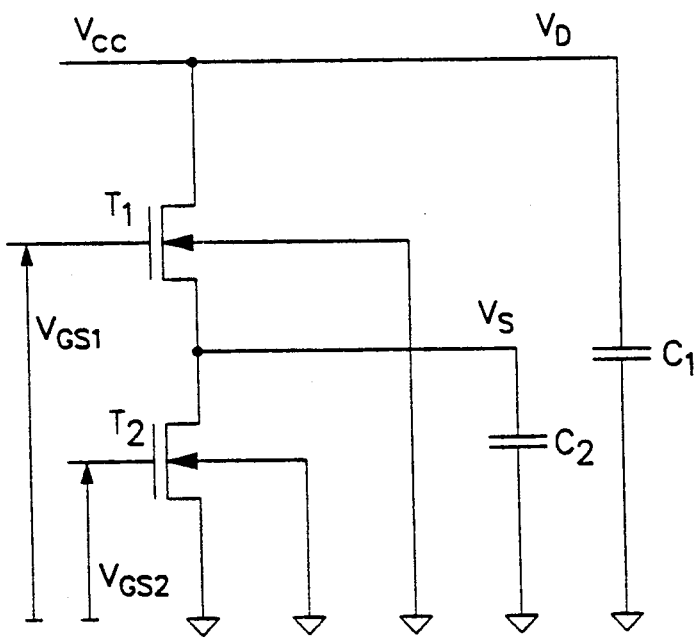
FIG. 3 is a schematic functional illustration of a NAND configured gate comprising two stacked N-MOS transistors illustrating the function of the present invention.

FIG. 4 illustrates a circuit according to the present invention, which is functionally equivalent to the circuit of FIG. 3 but it may be realized by employing a NAND configuration which comprises two stacked N-MOS transistors, N1 and N2, respectively, for the first inverter and N3 and N4, respectively, for the second inverter, while forming a graded diffusion only in the drain region which is connected to the output of the respective inverter, of the two pairs of N-MOS transistors, i.e., N1 and N3.

Figure 2:
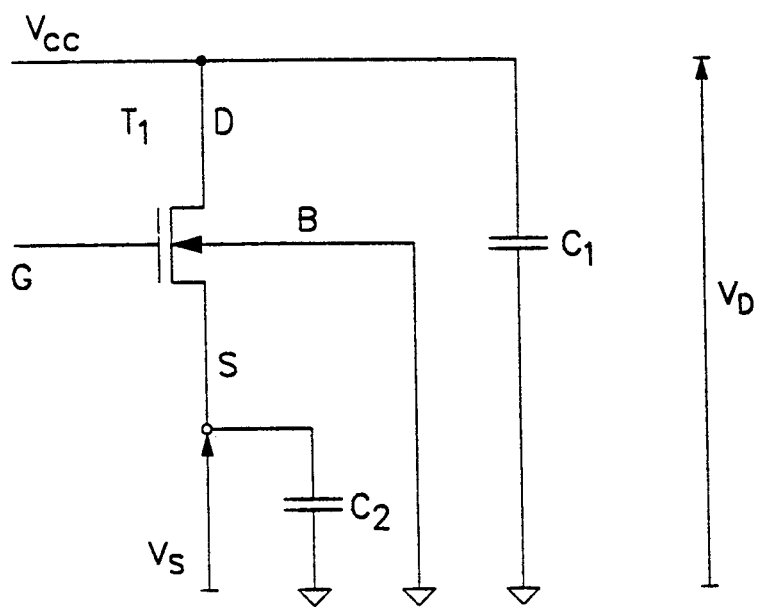
FIG. 2 is a schematic functional illustration of an N-MOS transistor illustrating the function of the present invention.

The operation of the invention and how the body effect of the substrate is advantageously used will now be explained with respect to FIGS. 2 and 3. It is known that the ability of a MOS transistor to transfer a signal is tied to its threshold voltage. The latter is in turn a function of the substrate voltage with respect to the source voltage. By referring to a functional illustration of a N-MOS transistor shown in FIG. 2, the threshold voltage of the transistor is given by:

$$V_{th}(V_S) = V_{tho} + K_{BE}(\sqrt{|V_S| + 2\phi_F} - \sqrt{2\phi_F})$$

where: $\phi_F$=Fermi's potential, $V_{tho}$=the extrapolated threshold in the linear region of the characteristic curve, and $K_{BE} = \sqrt{2q\epsilon_{Si}N_B}/C_{ox}$
where:
$E_{Si}$ is the dielectric constant; $N_B$ is the dopant concentration in number of dopant atoms per cm$^3$ in the substrate; $C_{OX}$ is the capacitance of the sandwich formed by the polycrystalline silicon gate/the silicon dioxide gate isolation layer/the semiconductor (substrate); $V_S$ is the source voltage;
and where $V_S = V_{BS}$ (i.e., the reverse bias voltage of the substrate, positive in an N-MOS transistor).

In practice the following mechanism may be assumed for the two possible states, low or high, respectively:

low state (0): the capacitance associated with the drain region of the transistor charges to the voltage $V_D$ which coincides with the supply voltage ($V_{CC}$).

The gate voltage $V_{GS}$=0V, therefore the N-MOS transistor T1 is OFF and the capacitance C2 has no charge (ground).

high state (1): the gate voltage $V_{GS}$ raises in time from 0V up to a maximum value: $V_{GS} = V_{CC}$. The N-MOS transistor T1 switches on and the capacitance C2 charges to a voltage $V_{S'}$, the end value of which is a function of the threshold voltage of the N-MOS transistor, according to the following expression:

$$V_S = V_D - V_{th}(V_S) = V_{CC} - V_{tho} - K_{BE}(\sqrt{|V_S| - 2\phi_F} - \sqrt{2\phi_F})$$

Therefore it may be said that the ability of the N-MOS transistor to transfer a voltage signal is a function of the bias voltage of the substrate.

Vice versa, in a NAND type configuration of two N-MOS transistors connected in series, that is circuitally "stacked" one on top of the other, as depicted in FIG. 3, the voltage $V_S$ (which coincides with the drain voltage of the transistor T2) is reduced in respect to the voltage $V_S$ of the circuit of FIG. 1, by a quantity given by the following expression:

$$V_{tho} + K_{BE}(\sqrt{V_{BS} + 2\phi_F} - \sqrt{2\phi_F})$$

Therefore, when the transistor T2 is forced to commute by the voltage $V_{GS2}$ passing from 0 V to $V_{CC}$, its drain voltage will no longer reach the dangerous level $V_D=V_{CC}$, which would otherwise make it necessary to form graded junctions (i.e. drain extension regions), vice versa because of the voltage level reaction due to the body effect, the transistor T2 may be designed without graded junctions.

In other words, the source of transistor $T_1$ is not connected to the substrate voltage. This creates a substrate effect, sometimes called body effect, so that the drain of transistor $T_2$ will not reach the dangerously high voltage and need not have a graded drain diffusion. Thus, the body effect which is considered a problem in some circuits is advantageously used to provide a circuit with a reduced number of graded junctions, as will now be described in more detail.

The circuit of FIG. 4, made according to the present invention, requires that only two N-MOS transistors have a single graded drain junction. By contrast, the circuit of FIG. 1, according to the prior art, required two N-MOS transistors provided with bilateral graded junctions (both source and drain regions) and two N-MOS transistors provided with at least a graded drain junction. The advantages in terms of enhanced performance and ability to be more easily compacted of the circuit made in accordance with the present invention compared with the equivalent circuit according to the prior art are evident.

Figure 5:
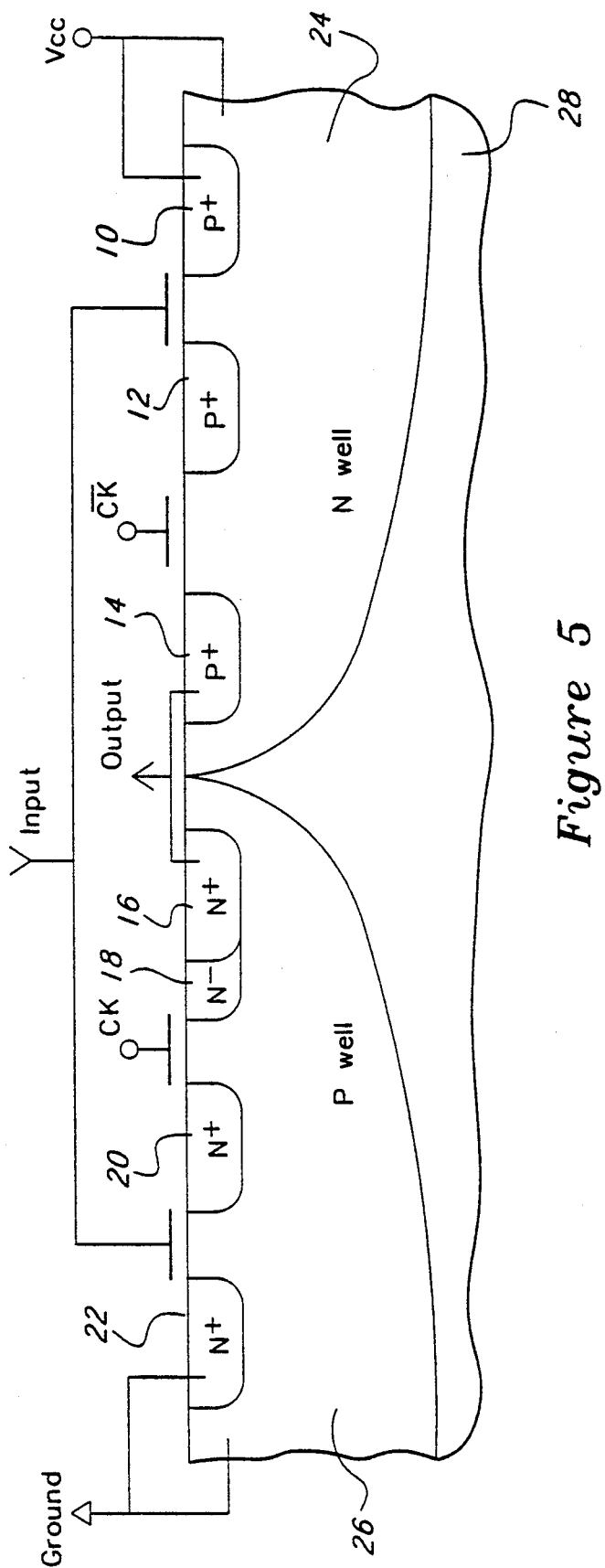
FIG. 5 is a cross-sectional view of the input transistors of FIG. 4.

As shown in FIG. 5, the first set of transistors P1, P2, N1 and N2 are shown in silicon cross-section. The drain 10 of the first transistor P1 is coupled to VCC, as is the N-well 24. (As will be appreciated by those of skill in the art, the substrate 28 could be N-type with only a P-well 26 formed, or alternatively, it could be P-type with only an N-well 24 formed.) The source of P1 and drain of P2 are a common diffusion 12. The source of P2 is electrically coupled to the drain 16 of N1, thus possibly subjecting this drain 16 to a high voltage. The transistor N1 is thus provided with a lightly doped drain 18, or graded drain extension 18. The source of N1 and drain on N2 are in a common diffusion 20, which diffusion 20 is not electrically connected to the substrate (the P-well 26 in this example). The P-well 26 is grounded and is thus at a different voltage than the source/drain diffusion 20. As previously explained and shown by the equations, the body effect on transistor N1 will reduce the voltage that is applied to the drain of transistor N2, thereby making it possible to not use either a graded drain on N2 or a graded source diffusion on N1. The source of N2 is coupled to ground as in the substrate, P-well 26. The clock and its complement are coupled to the gates of N1 and P2, respectively. The input is applied to the gates P1 and N1 and the output is taken from the electrical connection between the source of P2 and the drain of N1.

The present invention is useful both for designing logic circuits destined to operate at a relatively high supply voltage integrated in a P-type substrate (P-well) as well as in circuits integrated in an N-type substrate (N-well). In fact, in both cases, the logic circuit realized in accordance with the present invention offers advantages both in terms of reduced area requirement, speed, and may be easily compacted.

I claim:
1. An N-MOS circuit comprising:
    a first voltage of a selected potential;
    a first N-MOS transistor having a source, a channel and a drain with its drain coupled to said first selected voltage potential;
    a second N-MOS transistor having a source, a channel and a drain, the drain of the second transistor being formed in common with the source of the first N-MOS transistor having a uniform doping concentration from the channel of the first transistor to the channel of the second transistor, and the source of the second transistor coupled to a second selected voltage potential;
    a graded drain diffusion formed as part of the drain of said first N-MOS transistor with the region adjacent a channel of the first transistor being more lightly doped than the drain region which is spaced from the channel of the first N-MOS transistor; and
    the channel region of the first N-MOS transistor being at a different voltage potential than the source of the second N-MOS transistor, whereby the drain region of the second N-MOS transistor is not a graded diffusion which is more lightly doped towards the channel region of the second N-MOS transistor.
2. The N-MOS circuit according to claim 1 wherein said first selected voltage is in the range of 8–10 volts.
3. The N-MOS circuit according to claim 1 wherein said first voltage is in the range of 10–12 volts.
4. The N-MOS transistor according to claim 1 wherein said first N-MOS transistor is coupled to said first voltage via a pair of P channel transistors, the P channel transistors being coupled to the first voltage of a selected potential and transferring approximately this first voltage of a selected potential to the drain region of the first N-MOS transistor.
5. The N-MOS circuit according to claim 1, further including:
    a gate electrode formed over the channel region of the first N-MOS transistor;
    a clock signal coupled to said gate electrode over the channel region of the first N-MOS transistor; and
    a gate electrode coupled to an input signal over the channel region of the second N-MOS transistor.
6. The N-MOS circuit according to claim 1 further including:
    a substrate region, the first and second transistors being formed in the substrate region;
    the substrate region being directly coupled to the second selected voltage potential; and
    wherein the direct coupling is in close proximity with the source of the second transistor and spaced away from a channel region of the second transistor and the source of the first transistor.
7. The N-MOS circuit according to claim 1 wherein the source of the first transistor and the drain of the second transistor are a common diffusion formed commonly within a substrate, the common diffusion being a single diffusion which is approximately of uniform doping concentration throughout the entire diffusion.
8. A circuit comprising:
    a substrate region of a selected conductivity type;
    a first selected voltage potential coupled to said substrate of said selected conductivity type;

a plurality of transistors being formed within said substrate of a first conductivity type, said transistors being N-MOS transistors connected in series with each other and having said substrate as a channel region of each of said respective transistors;

a first transistor within said plurality of transistors, said first transistor having a drain region formed within said substrate, said drain region having a heavily doped diffusion region and a more lightly doped diffusion region adjacent said heavily doped diffusion region and also adjacent the channel region, such that said lightly doped diffusion region constitutes a graded diffusion extending from said heavily doped diffusion towards the channel region of said first transistor;

a gate electrode over the channel region of said first transistor;

a source diffusion adjacent to the channel region of said first transistor, said source diffusion being electrically separated from the voltage potential of said substrate such that said source diffusion is not at the same voltage potential as said substrate, resulting in a substrate body effect within said first transistor;

a second transistor within said plurality of transistors, said second transistor being connected in series with said first transistor with said drain of said second transistor being electrically connected to the source of said first transistor;

said drain of said second transistor having a generally uniform doping of a relatively high doping concentration for its entire diffusion;

a source diffusion as part of said second transistor, said source diffusion being electrically connected to the same voltage potential as said substrate, wherein said source diffusion of said first transistor and said drain diffusion of said second transistor are a common diffusion formed commonly within the substrate, being a single diffusion which is approximately of uniform doping concentration throughout the entire diffusion, said two transistors having only a single diffusion which is a graded diffusion, said graded diffusion being part of said first transistor and not being part of said second transistor, and a gate electrode positioned over the channel region between said source diffusion and said drain diffusion to form said second transistor of said plurality of transistors.

9. The circuit according to claim 8 wherein said substrate includes a R-well formed in a N-type substrate, said P-well being considered the substrate for said N-MOS transistors.

10. The circuit according to claim 8, further including:
an input signal coupled to the gate electrode of said second transistor; and
a clock signal coupled to the gate electrode of said first transistor.

11. The circuit according to claim 10, further including an output signal coupled to said drain diffusion of said first transistor.

12. The circuit according to claim 8, further including a plurality of P channel transistors coupled in series with each other between a selected voltage potential and said drain of said first transistor, said second selected voltage potential being sufficiently high as to potentially damage said first N-MOS transistor if a graded diffusion is not used, said graded diffusion serving to protect said first N-MOS transistor from premature aging by exposure to said relatively high voltage and said first N-MOS transistor protecting said second N-MOS transistor from premature aging by a voltage drop created by the combined effect of the threshold voltage and the body effect of the substrate.

13. The structure according to claim 12, further including:
an electrical connection between the gate of a first P channel transistor and the second N channel transistor, said gate electrodes of said respective transistors receiving the input signal; and
an electrical coupling between a source of a second P channel transistor and a drain of said first N-MOS transistor to form an output terminal.

14. A CMOS logic circuit synchronized by means of a clock signal comprising:
a substrate;
an inverter stage having an input node and an output node wherein the inverter stage is comprised of a first and a second N-MOS transistor functionally connected in series between a ground node and the output node of the circuit, a first and a second P-MOS functionally connected in series between said output node and a supply node;
a channel of the first N-MOS transistor;
a gate of the first N-MOS transistor being connected to the clock signal;
a gate of the second N-MOS transistor being connected to the input node;
a gate of the first P-MOS transistor being connected to the input node;
a gate of the second P-MOS transistor being connected to a logical complement of the clock signal;
a source of the second N-MOS transistor being connected to ground;
a drain of the first P-MOS transistor connected to the supply voltage;
a drain of the first N-MOS transistor being connected to the output node;
a source of the second P-MOS transistor being connected to the output node;
the source of the second P-MOS transistor and the drain of the first N-MOS transistor being electrically connected;
the drain of the first N-MOS transistor being a graded diffusion having a higher resistivity adjacent the channel of the first N-MOS transistor than adjacent the electrical connection to the source of the P-MOS transistor; and
a source of the first N-MOS transistor and the drain of the second N-MOS transistor being a common diffusion formed within the substrate, the common diffusion being approximately of uniform doping throughout the entire diffusion.

15. The CMOS logic circuit of claim 14 wherein the drain of the second N-MOS transistor is a nongraded diffusion.

16. The CMOS logic circuit of claim 14 wherein the inverter stage utilizes only a single graded diffusion.

17. A CMOS logic circuit synchronized by means of a clock signal and comprising at least an inverter stage having an input and an output and operable at a supply voltage sufficiently high to require the formation of graded diffusions, wherein the inverter stage comprises a first and second N-MOS transistor each N-MOS transistor having a channel and being in a stacked configuration between an output node and a ground node of the circuit, and comprises a first and second P-MOS transistor in a stacked configuration between the output node and a supply node, the second N-MOS transistor having a source coupled to the ground node and a gate coupled to the gate of the second P-MOS transistor and to an input node to operably receive an input signal therefrom, the first N-MOS transistor having a drain coupled to the output node and a gate coupled to a first clock signal, the second P-MOS transistor having a drain coupled to the supply node, the first P-MOS transistor having a source coupled to the output node and a gate coupled to a second clock signal that is the complement of the first clock signal, the source of the first N-MOS transistor and the drain of the second N-MOS transistor being formed in common and the drain of the first N-MOS transistor having a graded diffusion that has a higher conductivity at a region spaced away from the channel than at a region adjacent the channel, the source of the first N-MOS transistor and the drain of the second N-MOS transistor being a common diffusion formed commonly within a substrate, the common diffusion being approximately of uniform doping concentration in the direction from the channel region of first N-MOS transistor to the channel at the second N-MOS transistor.

18. A CMOS logic circuit comprising:
a substrate having a voltage potential;
a first transistor having:
a channel region;
a source diffusion adjacent to the channel region and being electrically separated from the voltage potential of the substrate such that the source diffusion is at a different voltage than the substrate to provide a substrate body effect;
a drain region formed within the substrate, the drain region being a graded diffusion having a heavily doped diffusion region and a more lightly doped diffusion region adjacent the heavily doped diffusion region, wherein the lightly doped diffusion region is adjacent the channel region;
a gate electrode positioned over the channel region between the source diffusion and the drain diffusion;
a second transistor coupled to the first transistor in a stacked configuration, the second transistor having:
a channel region;
a drain having a drain diffusion having in its entirety a generally uniform and relatively high doping concentration, the drain coupled to the source diffusion of the first transistor wherein the drain diffusion of the second transistor and the source diffusion of the first transistor are a common diffusion formed commonly within the substrate, the common diffusion being of approximately uniform doping concentration throughout, wherein the first and second transistors have only a single diffusion which is a graded diffusion, the graded diffusion being part of the first transistor and not being part of the second transistor;
a source diffusion coupled to the substrate wherein the source diffusion is at a same voltage as the substrate; and
a gate electrode positioned over the channel region between the source diffusion and the drain diffusion.

19. The circuit of claim 18 wherein the first voltage is in the range of 8–12 volts.

20. A CMOS logic circuit having at least one inverter stage comprising:
a first P-MOS transistor having a drain, a gate and a body, and a second P-MOS transistor coupled in a stacked configuration with the first P-MOS transistor, and having a gate, a source and a body;
a first N-MOS transistor having a drain, a gate and a body, and a second N-MOS transistor coupled in a stacked configuration with the first N-MOS transistor, and having a source, a gate and a body, the drain of the first N-MOS transistor being coupled to the source of the first P-MOS transistor, the gate of the first N-MOS transistor receiving a first clock signal, the gate of the first P-MOS transistor receiving a second clock signal which is the complement of the first clock signal, the gate of the second P-MOS transistor being coupled to the gate of the second N-MOS transistor and to an input node;
a third P-MOS transistor having a drain, a gate and a body, and a fourth P-MOS transistor coupled in a stacked configuration with the third P-MOS transistor and having a gate, a source and a body,
a third N-MOS transistor having a drain coupled to an output node, a gate, and a body, and a fourth N-MOS transistor coupled in a stacked configuration with the third N-MOS transistor, and having a source, a gate and a body, the drain of the third N-MOS transistor being coupled to the source of the third P-MOS transistor, the gate of the third N-MOS transistor receiving the second clock signal, the gate of the third P-MOS transistor receiving the first clock signal, the gate of the fourth P-MOS transistor being coupled to the gate of the fourth N-MOS transistor and to the drain of the first N-MOS transistor and source of the first P-MOS transistor to receive the output of the first N-MOS transistor, the drain of the first N-MOS transistor and the drain of the third N-MOS transistor each include a graded drain extension, the graded drain extension having a heavily doped diffusion region and a more lightly doped diffusion region adjacent the heavily doped diffusion region, wherein the lightly doped diffusion region is adjacent the channel region;
the drain of the second N-MOS transistor and the drain of the fourth N-MOS transistor not including a graded drain extension; and
wherein the source of the first N-MOS transistor and the drain of the second N-MOS transistor are a common diffusion.

21. The CMOS logic circuit of claim 20 wherein the source of the third N-MOS transistor and the drain of the fourth N-MOS transistor are a common diffusion.

22. An N-MOS circuit comprising:
a first N-MOS transistor having a source and a drain with its drain coupled to a voltage potential in the range of 10–12 volts;
a second N-MOS transistor having a source and a drain, the drain of the second transistor connected to the source of the first N-MOS transistor and the source of the second transistor coupled to a second selected voltage potential;
a graded drain diffusion formed as part of the drain of said first N-MOS transistor with the region adjacent a channel of the first transistor being more lightly doped than the drain region which is spaced from the channel of the first N-MOS transistor; and
the channel region of the first N-MOS transistor being coupled to a different voltage potential than the source of the second N-MOS transistor, whereby the drain region of the second N-MOS transistor is not a graded diffusion which is more lightly doped toward the channel region of the second N-MOS transistor.

* * * * *

UNITED STATES PATENT AND TRADEMARK OFFICE
CERTIFICATE OF CORRECTION

PATENT NO. :      5,311,073
DATED       :     May 10, 1994
INVENTOR(S) :     Carlo Dallavalle It is certified that error appears in the above-identified patent and that said Letters Patent is hereby corrected as shown below:

In claim 9, column 7, line 50, please delete "R-well" and substitute therefor --P-well--.

Signed and Sealed this

Eleventh Day of October, 1994

Attest:

BRUCE LEHMAN

Attesting Officer    Commissioner of Patents and Trademarks